(12) United States Patent
Kouya et al.

(10) Patent No.: US 9,445,535 B2
(45) Date of Patent: Sep. 13, 2016

(54) HIGH-FREQUENCY MODULE

(71) Applicant: DENSO CORPORATION, Kariya, Aichi-pref. (JP)

(72) Inventors: Takuya Kouya, Nagoya (JP); Masanobu Yukumatsu, Kariya (JP); Asahi Kondo, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/440,437

(22) PCT Filed: Nov. 5, 2013

(86) PCT No.: PCT/JP2013/079894
§ 371 (c)(1),
(2) Date: May 4, 2015

(87) PCT Pub. No.: WO2014/069658
PCT Pub. Date: May 8, 2014

(65) Prior Publication Data
US 2015/0289419 A1    Oct. 8, 2015

(30) Foreign Application Priority Data
Nov. 5, 2012    (JP) .................. 2012-243537

(51) Int. Cl.
*H04B 3/28*      (2006.01)
*H05K 9/00*      (2006.01)
*H01P 1/212*     (2006.01)
*H01P 1/203*     (2006.01)

(52) U.S. Cl.
CPC .......... *H05K 9/0009* (2013.01); *H05K 9/0022* (2013.01); *H05K 9/0037* (2013.01); *H01P 1/20345* (2013.01); *H01P 1/212* (2013.01)

(58) Field of Classification Search
CPC ............. H05K 9/0009; H05K 9/0022; H05K 9/0037; H01P 1/20345; H01P 1/212
USPC .......................................................... 333/12
See application file for complete search history.

(56) References Cited

U.S. PATENT DOCUMENTS 4,717,990 A  *  1/1988  Tugcu ................. H05K 9/0037
                                                     174/384
2007/0293173 A1    12/2007  Jiang
(Continued)

FOREIGN PATENT DOCUMENTS

JP        S63125404 U    8/1988
JP        H07240592 A    9/1995
(Continued)

OTHER PUBLICATIONS

International Search Report (in Japanese with English Translation) for PCT/JP2013/079894, mailed Jan. 14, 2014; ISA/JP.
(Continued)

*Primary Examiner* — Robert Pascal
*Assistant Examiner* — Kimberly Glenn
(74) *Attorney, Agent, or Firm* — Harness, Dickey & Pierce, P.L.C.

(57) ABSTRACT

A high-frequency module includes a substrate, an integrated circuit mounted to the substrate, a cylindrical shield enclosing the integrated circuit to block radio waves, a casing provided on an opposite side of the substrate relative to the shield to block radio waves, and a choke portion provided in an inner wall of the casing, the inner wall being opposed to the shield, or provided in the substrate, with a predetermined gap being formed relative to the shield, to create an anti-phase in radio waves having a predetermined frequency emitted from the integrated circuit into a space above the substrate.

10 Claims, 14 Drawing Sheets

(56) References Cited

U.S. PATENT DOCUMENTS

| | | |
|---|---|---|
| 2007/0293227 A1 | 12/2007 | Jiang |
| 2007/0293254 A1 | 12/2007 | Jiang |
| 2011/0163919 A1 | 7/2011 | Suzuki |
| 2012/0112765 A1* | 5/2012 | Sparks ............... G01N 29/022 324/633 |
| 2014/0098499 A1 | 4/2014 | Kasahara et al. |

FOREIGN PATENT DOCUMENTS

| | | |
|---|---|---|
| JP | H10107476 A | 4/1998 |
| JP | 2001185887 A | 7/2001 |
| JP | 2002050733 A | 2/2002 |
| JP | 2008005461 A | 1/2008 |
| JP | 2008005491 A | 1/2008 |
| JP | 2010062584 A | 3/2010 |
| JP | 2011155287 A | 8/2011 |
| JP | 2011258748 A | 12/2011 |
| WO | WO-2012169104 A1 | 12/2012 |

OTHER PUBLICATIONS

International Preliminary Report on Patentability (in Japanese with English Translation) for PCT/JP2013/079894, issued May 5, 2015; ISA/JP.

* cited by examiner (a)

(b)

(c)

(a)

(b)

(c)

HIGH-FREQUENCY MODULE

CROSS REFERENCE TO RELATED APPLICATIONS

This application is a U.S. National Phase Application under 35 U.S.C. 371 of International Application No. PCT/JP2013/079894 filed on Nov. 5, 2013 and published in Japanese as WO 2014/069658 A1 on May 8, 2014. This application is based on and claims the benefit of priority from Japanese Application No. 2012-243537 filed on Nov. 5, 2012. The entire disclosures of all of the above applications are incorporated herein by reference.

TECHNICAL FIELD

The present invention relates to a high-frequency module used such as for a millimeter-wave or microwave radar.

BACKGROUND ART

Recently, there is known an automatic inter-vehicle control system (ACC: adaptive cruise control) or a collision avoidance system, which monitors the conditions, for example, ahead of a vehicle by a radar and performs throttle control and brake control according to the conditions. The radar used for these systems uses a high-frequency module capable of transmitting and receiving high-frequency signals such as of millimeter waves or microwaves.

The high-frequency module transmits, from an antenna, a signal generated by a transmitting circuit and allows a receiving circuit to receive, via the antenna, a signal that has been returned being reflected from a target. The receiving circuit compares a signal supplied from the transmitting circuit via the wiring of a substrate with the signal received via the antenna and detects, for example, the position of and the distance to the target.

If the signal generated by the transmitting circuit is transmitted to the receiving circuit by way of a space above the substrate without passing through the wiring of the substrate, some problems arise such as of impairing isolation, lowering detection accuracy in respect such as of the position of and the distance to a target, or generating ghost.

Patent Literature 1 describes a high-frequency module including a casing in which a substrate that is mounted with a transmitting circuit and a receiving circuit is housed, and the opening of the casing is covered up with a shield frame made of metal. The transmitting circuit is enclosed by the shield frame and a bulkhead made of metal extending from the shield frame toward the substrate. Opposite to the bulkhead intervened by the substrate, an elastic member is provided being sandwiched between the substrate and the casing. When the elastic member presses the substrate against the bulkhead, the ground wiring provided to the substrate is reliably brought into contact with the bulkhead. The shield frame and the bulkhead prevent the high-frequency signals generated by the transmitting circuit from leaking out of the shield frame and the bulkhead.

CITATION LIST

Patent Literature

[Patent Literature 1] JP-A-10-107476

SUMMARY OF INVENTION

Technical Problem

However, Patent Literature 1 has problems as set forth below.

(1) Addition of the elastic member to the configuration increases the number of parts of the high-frequency module and thus increases the manufacturing cost.

(2) Contact of the substrate with the elastic member limits the space in which electronic parts can be mounted to the substrate.

(3) Difference in linear expansion coefficient between the elastic member, the substrate and the casing causes thermal deformation in the substrate to apply a stress to the substrate, which leads to a probability of causing detachment, falling off or disconnection of the electronic parts mounted to the substrate.

(4) Vibration of the vehicle that installs the high-frequency module may cause the ground wiring of the substrate to slide relative to the bulkhead to produce conductor scraps, which leads to the probability of causing short circuiting in the circuit.

Thus, in Patent Literature 1, the manufacturing cost of the high-frequency module is increased, while there is a concern in the reliability of the output signals of the module.

Solution to Problem

An embodiment provides a high-frequency module that is able to enhance reliability.

A high-frequency module according to an embodiment includes a substrate, an integrated circuit mounted to the substrate, a cylindrical shield enclosing the integrated circuit to block radio waves, a casing provided on an opposite side of the substrate relative to the shield to block radio waves, and a choke portion provided in an inner wall of the casing, the inner wall being opposed to the shield, or provided in the substrate, with a predetermined gap being formed relative to the shield, to create an antiphase in radio waves having a predetermined frequency emitted from the integrated circuit into a space above the substrate.

DESCRIPTION OF EMBODIMENTS

With reference to the drawings, hereinafter are described some embodiments of the present invention.

First Embodiment

FIGS. 1 to 7 show a first embodiment of the present invention. A high-frequency module 1 of the present embodiment is used for a radar that transmits and receives high-frequency signals such as of millimeter waves or microwaves.

Figure 1:
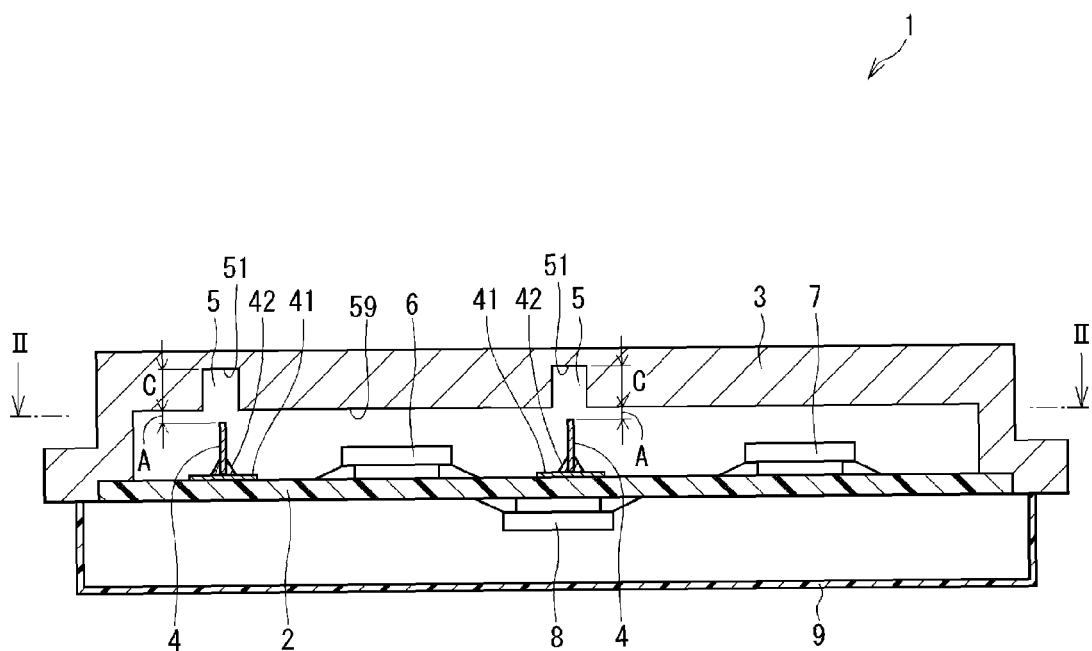
FIG. 1 is a cross-sectional view illustrating a high-frequency module according to a first embodiment.
Figure 2:
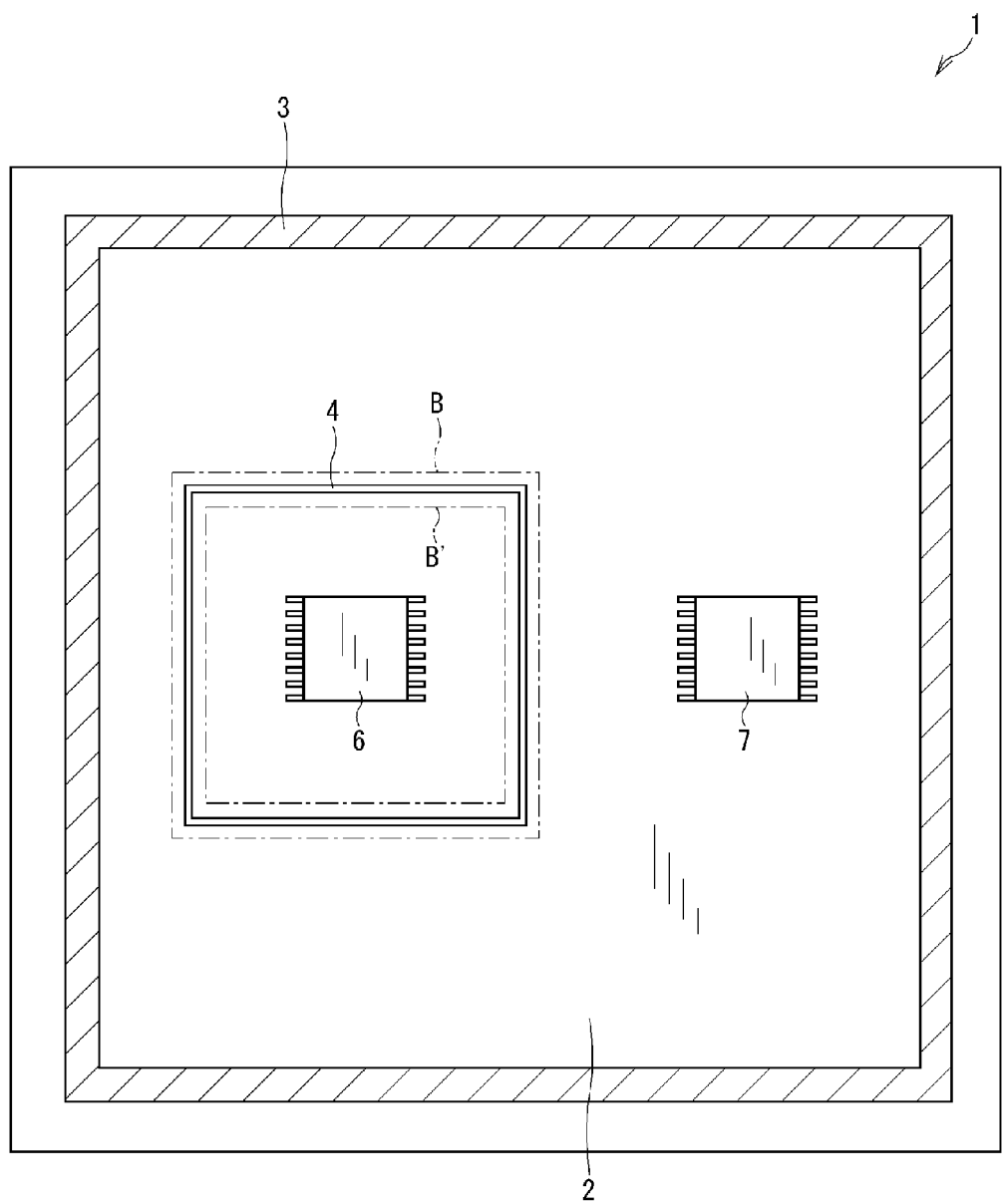
FIG. 2 is a cross-sectional view taken along a line II-II of FIG. 1.

As shown in FIGS. 1 and 2, the high-frequency module 1 includes an electronic circuit mounted to a substrate 2, a casing 3, a shield 4 and a choke portion 5.

The substrate 2 is a multilayer substrate, such as FR-4 or FR5. The substrate 2 is mounted with an electronic circuit which includes a transmitting circuit 6, a receiving circuit 7, a signal processing circuit 8 and an antenna, not shown.

The transmitting circuit 6 and the receiving circuit 7 are each configured by, for example, a monolithic microwave integrated circuit (MMIC), or by mounting a transistor, a diode and the like on the substrate 2.

The transmitting circuit 6, the receiving circuit 7 and the signal processing circuit 8 of the present embodiment correspond to the "integrated circuit".

The transmitting circuit 6 generates a high-frequency signal such as of a millimeter wave or a microwave, which is transmitted, for example, toward a target from an antenna that is provided to a surface of the substrate 2, the surface being on the opposite side of the transmitting circuit 6. It should be noted that the antenna may be provided to a substrate that is separate from the substrate of the transmitting circuit 6.

A part of the high-frequency signals generated by the transmitting circuit 6 is supplied to the receiving circuit 7 via the wiring of the substrate 2.

The receiving circuit 7 again receives, via the antenna, the signal that has been returned being reflected from the target. The signal processing circuit 8 compares a signal supplied from the transmitting circuit 6 via the wiring of the substrate 2, with the signal received via the antenna and detects, for example, the position of and the distance to the target.

The casing 3 is formed into a shape of a dish from a conductive material, such as metal, with the substrate 2 being mounted to an end portion thereof. The casing 3 covers the substrate 2 on a side mounting the transmitting circuit 6 and the receiving circuit 7. The casing 3 prevents radio waves from being radiated out of the sensor, the radio waves being emitted from the transmitting circuit 6 into a space above the substrate.

A cover 9 made of resin is provided on the opposite side of the casing 3, being intervened by the substrate 2. The cover 9 transmits therethrough the radio waves emitted from the antenna and the radio waves received by the antenna.

The shield 4 is made, for example, of a conductive material, such as metal, and formed into a cylindrical shape to enclose the transmitting circuit 6. The shield 4 is connected via solder 42 to a ground wiring 41 provided to the substrate 2.

The shield 4 has an end face on an opposite side of the substrate 2, the end face being spaced apart, by a distance A, from a substrate-side end face of the casing 3. The distance A is set so as to be larger than 0. The distance A is set according to the target reduction amount of radio wave leakage, which reduction amount is attributed to the effect of the choke portion 5 as will be described later.

The choke portion 5 is formed of a groove 51 that is provided in an inner wall of the casing 3 which is opposed to the shield 4. The groove 51 is formed being recessed in the casing 3 from an end face 59 thereof opposed to the shield 4, toward an opposite side of the shield 4. In FIG. 2, the location of the choke portion 5 provided in the inner wall of the casing 3 is indicated by dash-dot lines B and B'.

The radio waves of a predetermined frequency generated by the transmitting circuit 6 and emitted into the space above the substrate have a wavelength $\lambda$. The choke portion 5 has a depth C which is set to a length of $\lambda/4$.

Thus, the radio waves, which are emitted from the transmitting circuit 6 and permitted to enter the groove 51 and again go out of the groove 51 (hereinafter referred to as "reflected waves"), are delayed in phase from the radio waves before entering the groove 51 (hereinafter referred to as "incident waves") by the amount of a ¼ wavelength for a distance from the entrance to the dead end of the groove 51 and by the amount of a ¼ wavelength for a distance from the dead end to the entrance. Accordingly, the incident waves and the reflected waves create a so-called antiphase relationship, in which the phase is offset by a ½ wavelength, and cancel out each other. Thus, the choke portion 5 is able to suppress the radio waves having the frequency of the wavelength $\lambda$ from leaking out of the shield 4.

Using an analysis model of the high-frequency module 1, hereinafter is described a relationship between frequency and passage loss.

Figure 3:
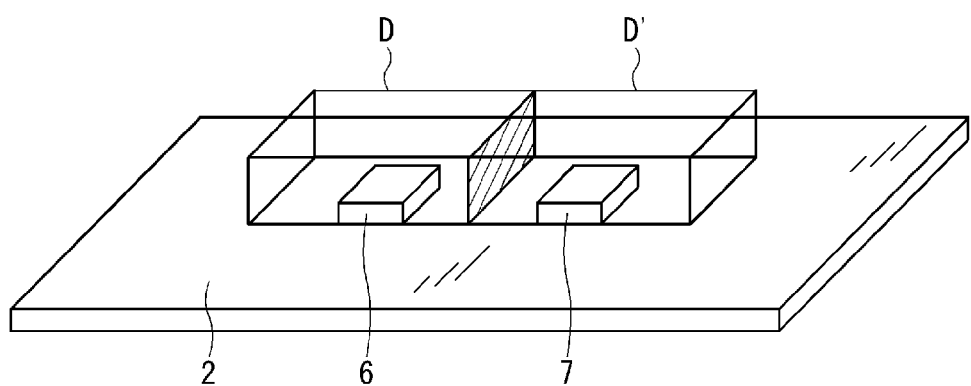
FIG. 3 shows an analysis model of the high-frequency module.

FIG. 3 shows an area that is an analysis model represented by cuboids D and D' in the high-frequency module 1 of the first embodiment. The shaded area in FIG. 3 corresponds to a portion where the shield 4 is provided.

Figure 4:
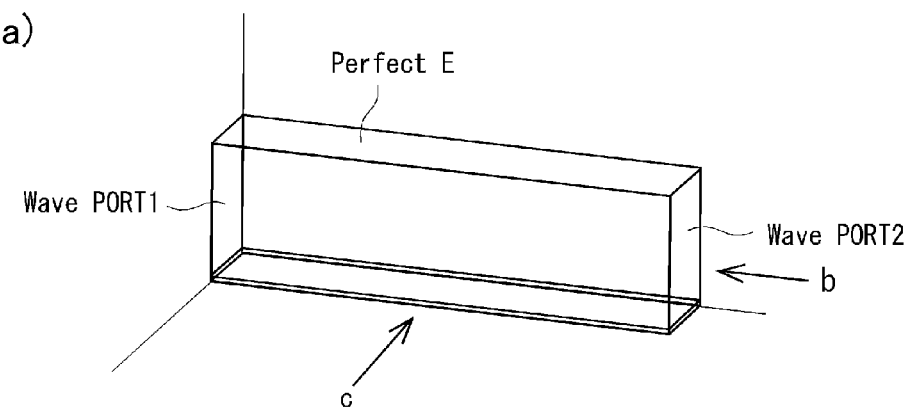
FIG. 4 (*a*) to (*c*) show the analysis model in a case where a choke portion and a shield are not provided to the model shown in FIG. 3.
Figure 4:
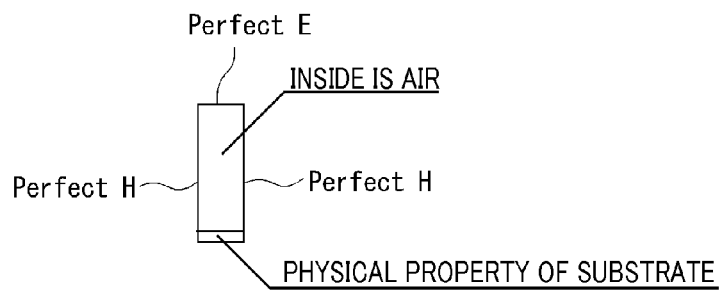
Figure 4:
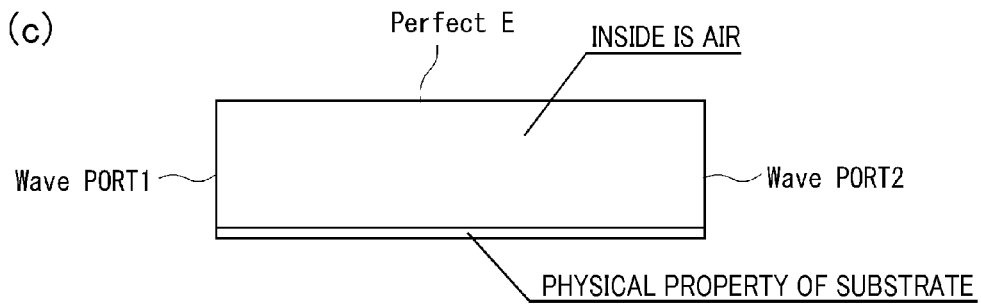

FIGS. 4 (a) to (c) show the analysis model which is not provided with the choke portion 5 and the shield 4 in the area shown in FIG. 3. FIG. 4 (b) shows the model as viewed from the direction of an arrow b in FIG. 4 (a). FIG. 4 (c) shows the model as viewed from a direction of an arrow c in FIG. 4 (a). The inside of the model is air, and the substrate is its physical property.

In FIGS. 4 (a) to (c), Perfect H indicates a boundary condition in a side face of the area, and Perfect E indicates a boundary condition in an upper face of the area (boundary condition in an inner wall surface of the casing 3). Wave PORT 1 indicates an analysis-area end face on a transmitting circuit side, and Wave PORT 2 indicates an analysis-area end face on a receiving circuit side.

In the analysis model shown in FIGS. 4 (a) to (c), a signal was inputted from the Wave PORT 1 to calculate a passage loss of the signal outputted from the Wave PORT 2.

Figure 5:
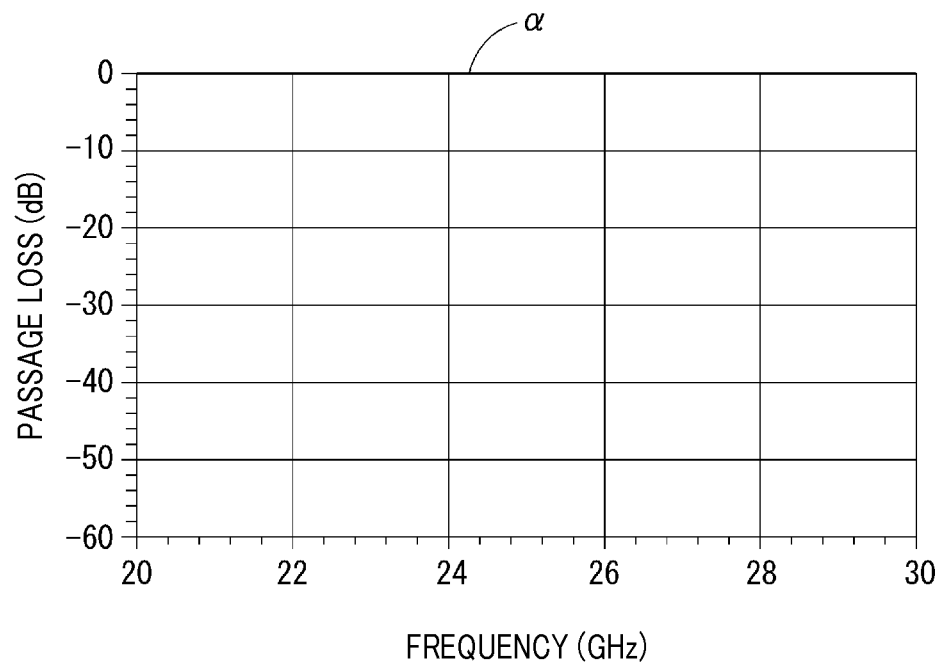
FIG. 5 is a graph showing a relationship between frequency and passage loss in the analysis model shown in FIGS. 4 (*a*) to (*c*)

As indicated by a solid line α in a graph of FIG. 5, the passage loss was only slight at all the frequencies. This is considered to be because the dielectric constant and the dielectric loss are realistic in the settings on the substrate member, and because the model is ideal in the structure (parameters) except for the substrate.

Figure 6:
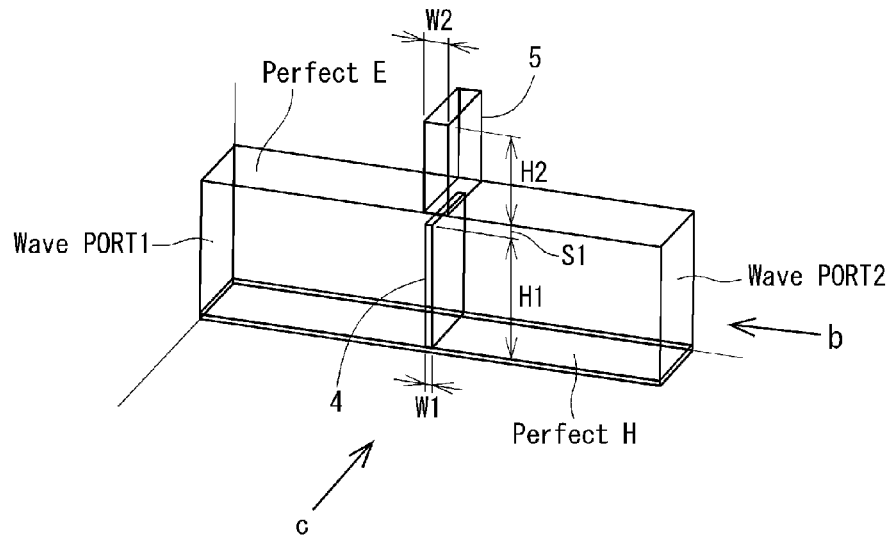
FIGS. 6 (*a*) to (*c*) show an analysis model in a case where a choke portion and a shield are provided to the model shown in FIG. 3.
Figure 6:
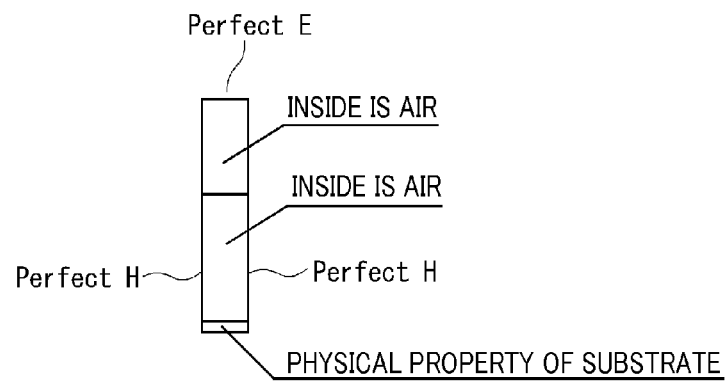
Figure 6:
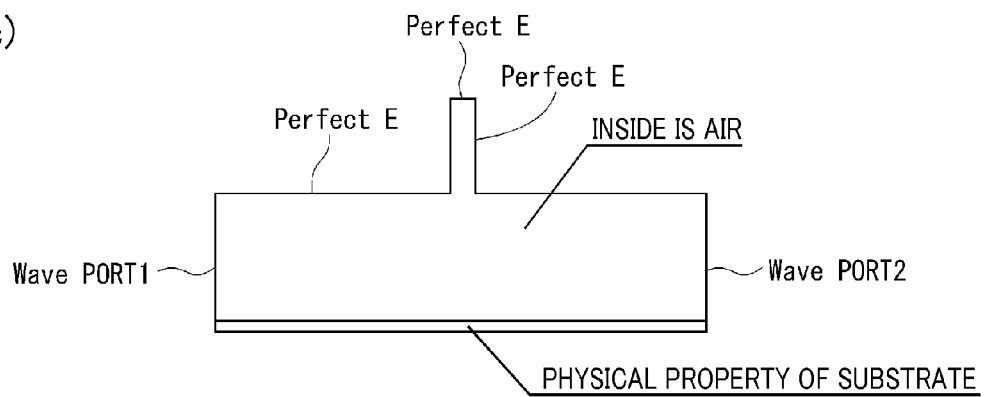

FIG. 6 (a) to (c) show the analysis model which is provided with the shield and the choke portion in the area shown in FIG. 3. In FIG. 6 (a), the shield is indicated by a reference 4, and the choke portion is indicated by a reference 5.

FIG. 6 (b) shows the model as viewed from the direction of an arrow b in FIG. 6 (a). FIG. 6 (c) shows the model as viewed from the direction of an arrow c in FIG. 6 (a). The inside of the model is air, and the substrate is its physical property.

In the setting of the analysis model shown in FIGS. 6 (a) to (c), the shield has a width W1 of 0.4 mm and a height H1 of 2.75 mm, with a gap S1 of 0.15 mm being provided between the shield and the choke portion. The choke portion has a width W2 of 2.2 mm and a depth H2 of 3.16 mm.

In the analysis model shown in FIG. 6 by (a) to (c), a signal was inputted from the Wave PORT 1 to calculate a passage loss of the signal outputted from the Wave PORT 2.

Figure 7:
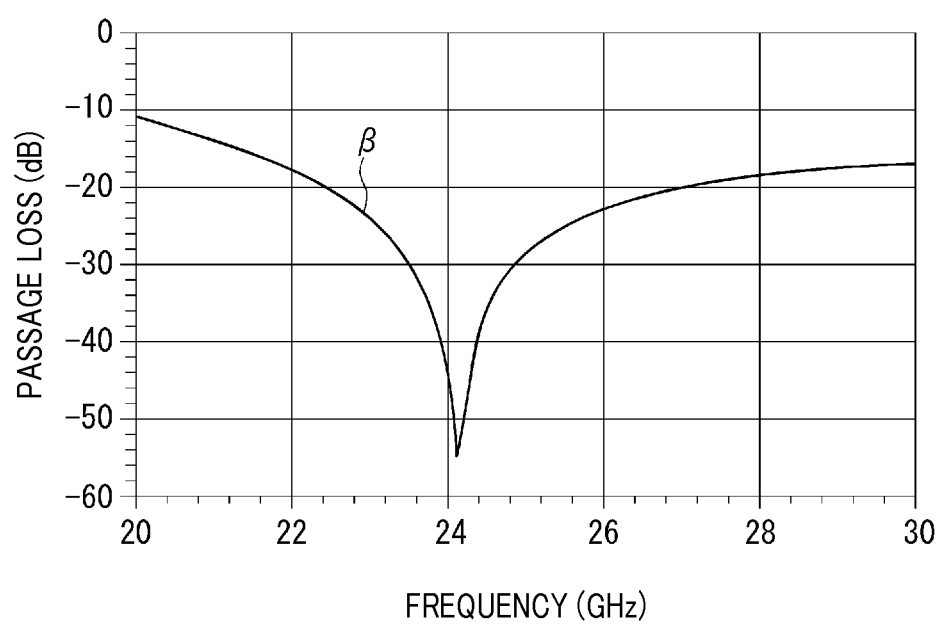
FIG. 7 is a graph showing a relationship between frequency and passage loss in the analysis model shown in FIGS. 6 (*a*) to (*c*)

As indicated by a solid line β in a graph of FIG. 7, the passage loss in the analysis model shown in FIG. 6 by (a) to (c) was −50 to −60 (dB) at frequencies around 24 GHz. This is because the radio waves around 24 GHz passing through the gap between the choke portion 5 and the shield 4 have been cancelled by the radio waves reflected from the choke portion 5.

It should be noted that, the gap S1 between the choke portion 5 and the shield 4, the width W2 of the choke portion 5, and the like can be set according to the target reduction amount of radio wave leakage.

The results set forth above have revealed that the choke portion 5 is able to reduce leakage of radio waves of a predetermined frequency from the gap between the choke portion 5 and the shield 4.

FIGS. 13 to 16 show high-frequency modules according to a plurality of comparative examples.

Figure 13:
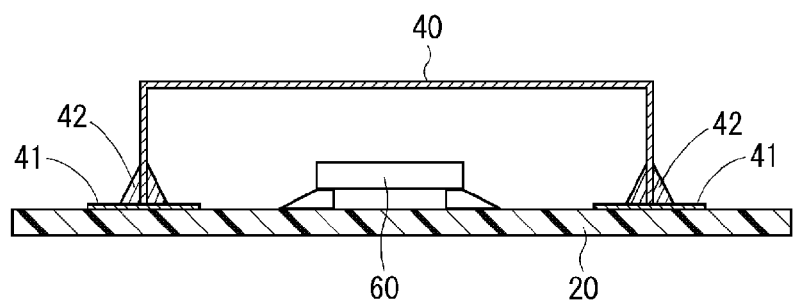
FIG. 13 is a cross-sectional view illustrating a high-frequency module according to a first comparative example.

As shown in FIG. 13, in a first comparative example, a transmitting circuit 60 is covered with a bottomed cylindrical shield cap 40. The shield cap 40 is formed of a conductive material and bonded via solder 42 to a ground wiring 41 of a substrate 20. It should be noted that a radio wave absorber, not shown, may be provided inside the shield cap 40.

In the first comparative example, it is difficult to inspect the appearance of the transmitting circuit 60 after mounting the shield cap 40 to the substrate 20.

Figure 14:
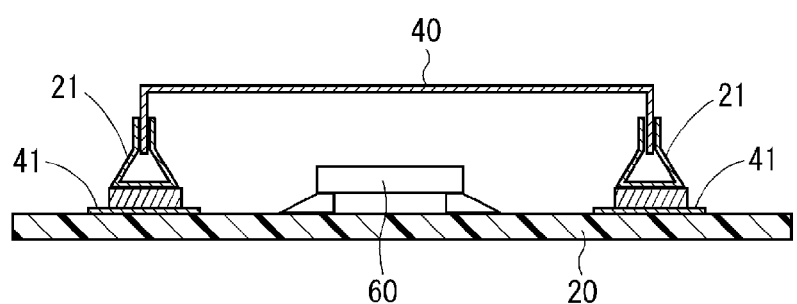
FIG. 14 is a cross-sectional view illustrating a high-frequency module according to a second comparative example.

As shown in FIG. 14, in a second comparative example, a plurality of clips 21 are mounted to the ground wiring 41 of the substrate 20, while the shield cap 40 is mounted to the clips 21.

In the second comparative example, use of the clips 21 increases the number of parts and thus increases the manufacturing cost. Further, when the frequency as a target of leakage prevention becomes higher, the interval between the plurality of clips 21 has to be made smaller and thus the number of clips 21 is increased to further increase the manufacturing cost.

Figure 15:
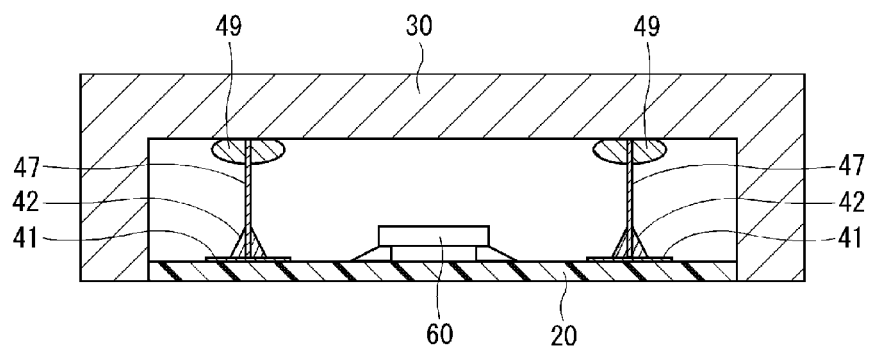
FIG. 15 is a cross-sectional view illustrating a high-frequency module according to a third comparative example.

As shown in FIG. 15, in a third comparative example, a cylindrical shield 47 is bonded via the solder 42 to the ground wiring 41 of the substrate 20 around the transmitting circuit 60. The shield 47 has an end portion on an opposite side the substrate 20, which is connected to a casing 30 via a conductive adhesive 49.

In the third comparative example, in the event that the conductive adhesive 49 is peeled off due to vibration or heat, there is a concern that the high frequency leaks from the gap.

Figure 16:
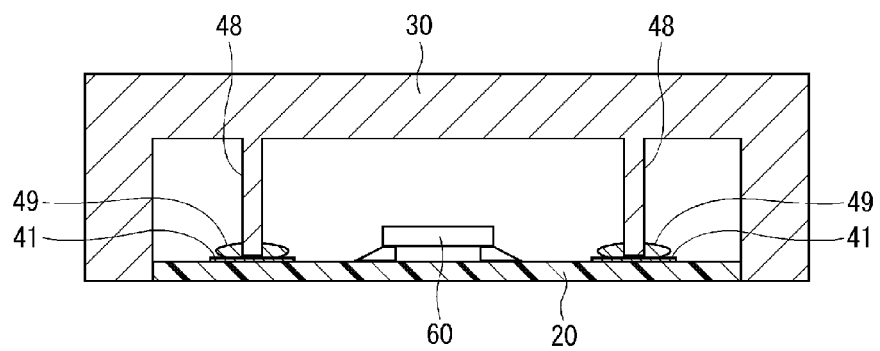
FIG. 16 is a cross-sectional view illustrating a high-frequency module according to a fourth comparative example.

As shown in FIG. 16, in a fourth comparative example, the transmitting circuit 60 is enclosed by a shield 48 that is integrally formed into the casing 30. The shield 48 has an end portion on an opposite side of the casing 30, which is connected to the ground wiring 41 of the substrate 20 via the conductive adhesive 49.

In the fourth comparative example as well, there is a concern of causing a problem similar to the third comparative example.

In contrast to the first to fourth comparative examples set forth above, the first embodiment provides the advantageous effects as described below.

(1) In the first embodiment, the cylindrical shield 4 and the choke portion 5 suppress leakage of the radio waves of a predetermined frequency emitted from the transmitted circuit 6. Accordingly, radio wave signals can be prevented from being unintentionally supplied from the transmitting circuit 6 to the receiving circuit 7 via the space above the substrate. Thus, good isolation is achieved of the signals received by the receiving circuit 7. In this way, reliability of the output signals of the high-frequency module 1 is enhanced.

(2) In the first embodiment, the shield 4 has a cylindrical shape. Therefore, after mounting the shield 4 to the substrate 2, the appearance of the transmitting circuit 6 can be inspected.

(3) In the first embodiment, the groove 51 provided to the casing 3 serves as the choke 5. Therefore, the manufacturing cost can be reduced without increasing the number of parts configuring the high-frequency module 1.

(4) In the first embodiment, a gap is provided between the casing 3 and the shield 4. Accordingly, the substrate 2 is prevented from being applied with a stress that would be caused by the vibration or the thermal deformation of the casing 3 and the substrate 2. Thus, regardless of a stress applied to the substrate 2, the electronic parts mounted to the substrate 2 are prevented from being detached, falling off or being disconnected from the substrate.

(5) In the first embodiment, the groove 51 forming the choke portion 5 has a depth corresponding to a ¼ length of the wavelength λ of a predetermined frequency. Accordingly, the choke portion 5 creates an antiphase in the reflected waves relative to the incident waves, allowing the incident waves and the reflected waves to cancel out each other.

Second Embodiment

Figure 8:
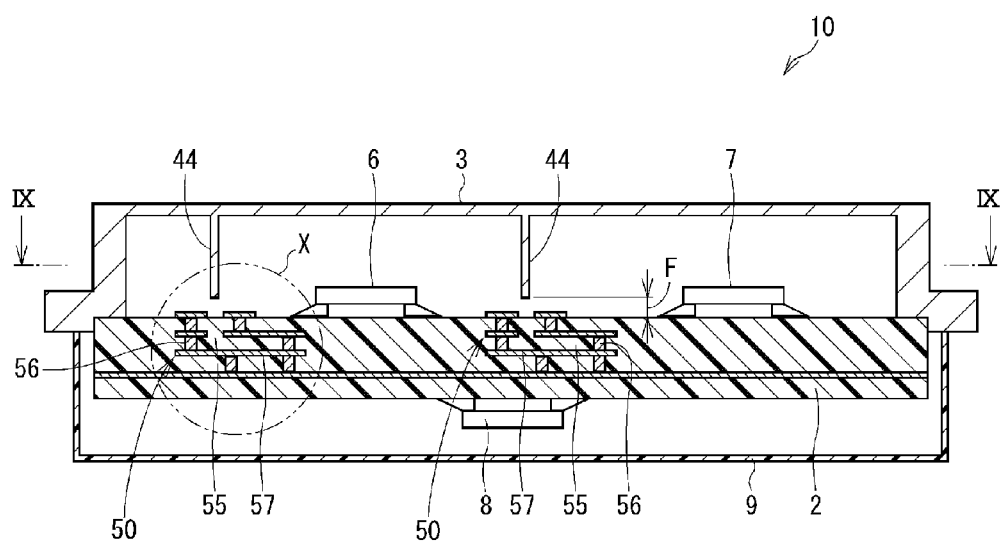
FIG. 8 is a cross-sectional view illustrating a high-frequency module according to a second embodiment.
Figure 9:
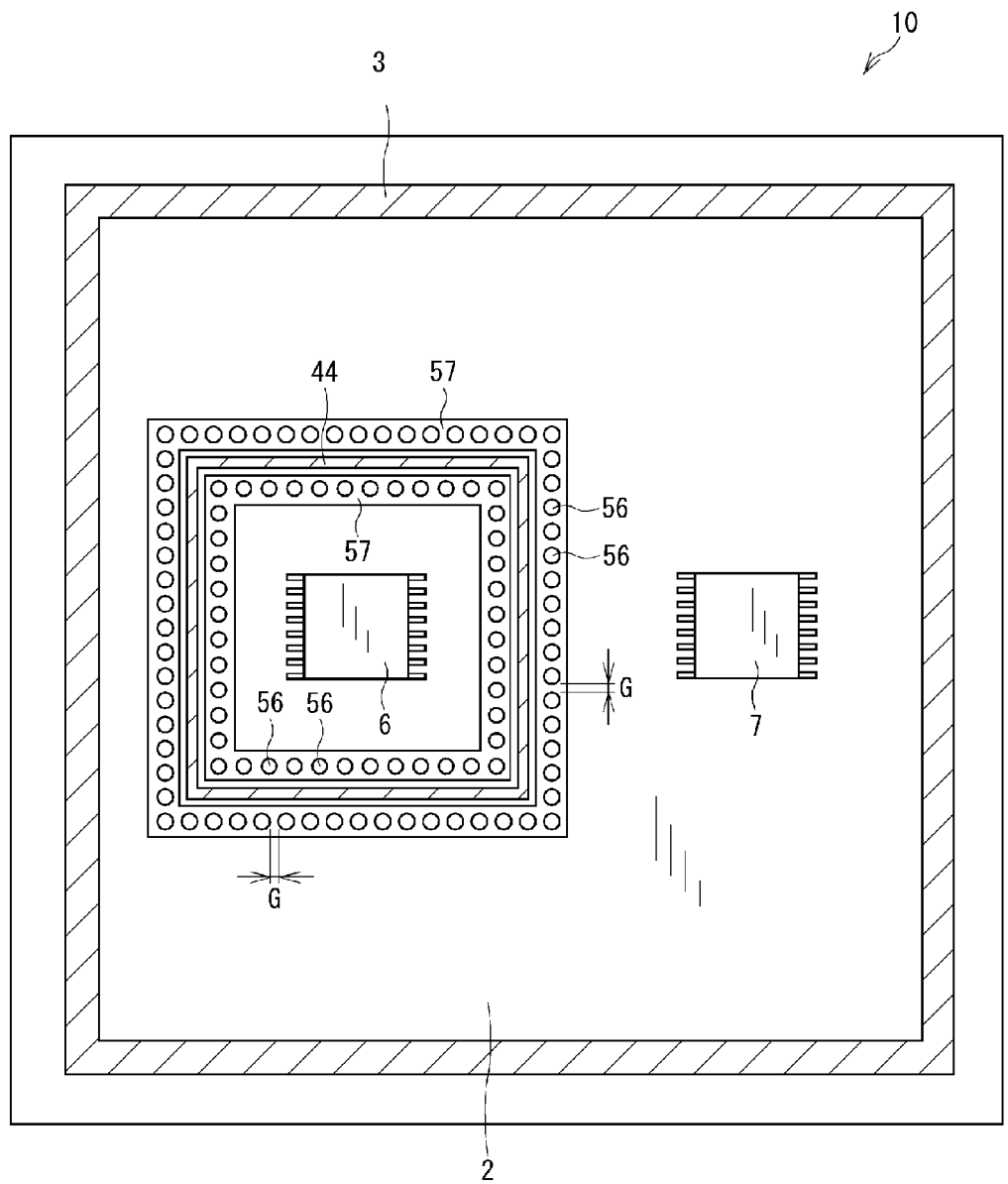
FIG. 9 is a cross-sectional view taken along a line IX-IX of FIG. 8.
Figure 10:
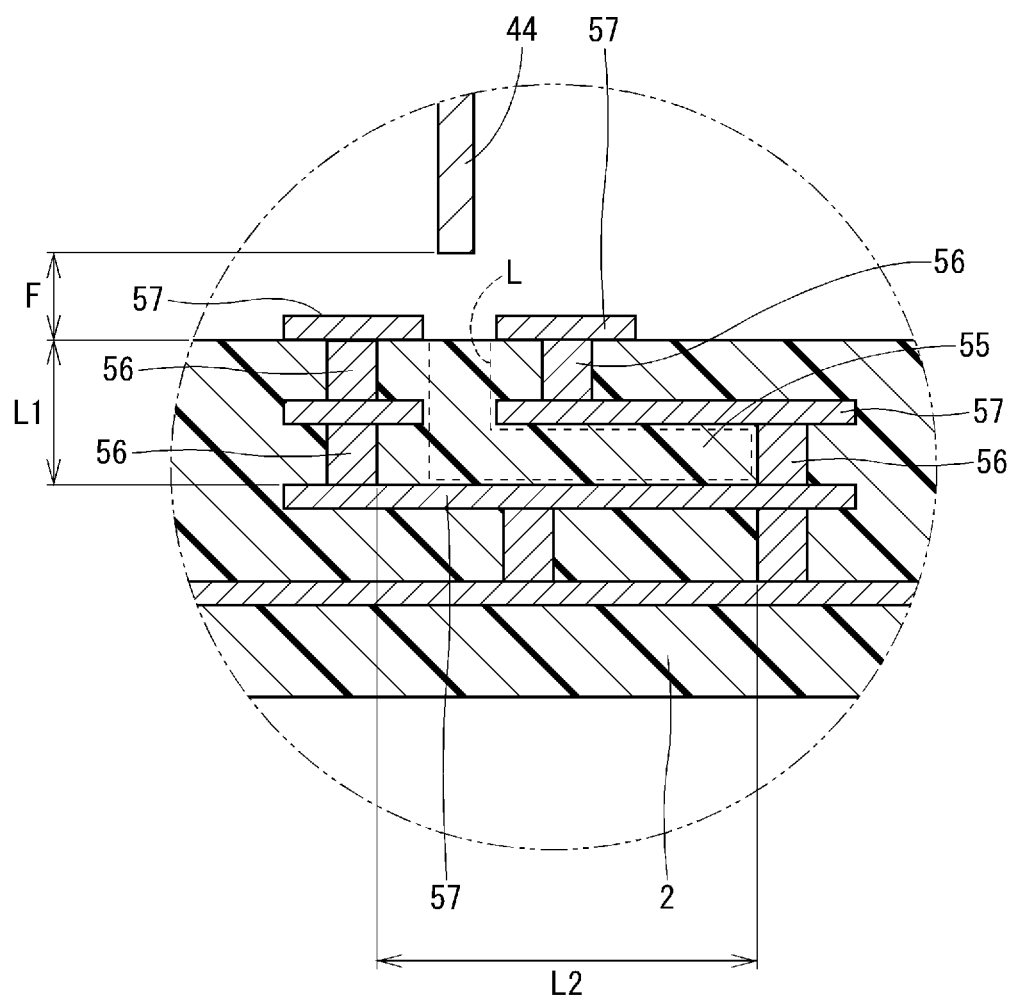
FIG. 10 is an enlarged view illustrating a portion X of FIG. 8.

Referring to FIGS. 8 to 10, a second embodiment of the present invention will be described. In the following embodiments, the components substantially identical with those of the first embodiment are given the same reference numerals for the sake of omitting explanation.

In a high-frequency module 10 of the second embodiment, a shield 44 is cylindrically formed being integrated with the casing 3 to enclose the transmitting circuit 6. A very small gap is provided between the shield 44 and the substrate 2. The gap has a distance F which is set so as to be larger than 0. The distance F is set according to the target reduction amount of radio wave leakage, which reduction amount is attributed to the effect of the choke portion 50 provided to the substrate 2.

In the second embodiment, the choke portion 50 is provided to the substrate 2. The choke portion 50 is configured by a dielectric body 55 forming the substrate 2, and via holes 56 and a ground wiring 57 which are provided to the substrate 2.

The dielectric body 55 is formed of the same material as the one forming the substrate 2, and thus is a part of the substrate 2. The dielectric body 55 extends from an end face of the substrate 2, the end face being opposed to the shield 44, in the thickness direction of the substrate 2, and then extends in the planar direction of the substrate 2 at a constant depth. Thus, the dielectric body 55, in a cross-sectional view of the substrate 2, is provided in an L shape. In FIG. 10, the L shape is schematically indicated by a dashed line L.

The dielectric body 55 forming the substrate 2 has a relative dielectric constant which is larger than that of the air. Therefore, the radio waves passing through the dielectric body 55 have a wavelength which is shorter than the wavelength of the radio waves transmitting through the air above the substrate. In the second embodiment, the radio waves of a predetermined frequency emitted into the space above the substrate from the transmitting circuit 6 have a wavelength $\lambda'$ when passing through the dielectric body 55. The L-shaped dielectric body 55 extends in the thickness direction of the substrate 2 by a length L1 and extends in the planar direction thereof by a length L2, with the sum of these lengths being set to ¼ of the wavelength $\lambda'$.

Thus, the radio waves that are emitted from the transmitting circuit 6 and enter the dielectric body 55 of the choke portion 50 and again go out of the dielectric body 55 (hereinafter referred to as "reflected waves") have an antiphase relative to the radio waves before entering the dielectric body 55 (hereinafter referred to as "incident waves"), and are restored to the original wavelength $\lambda$ to thereby cancel the radio waves emitted from the transmitting circuit 6. In this way, the choke portion 50 suppresses the radio waves from leaking out of the shield 44.

The plurality of via holes 56 are juxtaposed outside the L-shaped dielectric body 55 with a predetermined gap G therebetween. The predetermined gap G is set to not more than ¼ of the wavelength $\lambda'$. Thus, the radio waves having the wavelength $\lambda'$ and passing through the dielectric body 55 are prevented from leaking outside through the gaps between the plurality of via holes 56.

The second embodiment provides the advantageous effects as provided below.

(1) In the second embodiment, the shield 44 is formed being integrated with the casing 3. Thus, the number of parts is reduced and thus the manufacturing cost is reduced.

(2) In the second embodiment, the choke portion 50 is configured by the dielectric body 55 forming the substrate 2, the plurality of via holes 56 juxtaposed outside the dielectric body 55, and the ground wiring 57. Thus, the choke portion 50 can be configured in the substrate 2 with a simple configuration.

(3) In the second embodiment, the plurality of via holes 56 are provided with a gap therebetween, the gap being not more than ¼ of the wavelength $\lambda'$ of the radio waves when passing through the dielectric body, the radio waves being emitted from the transmitting circuit 6. Thus, the radio waves having the wavelength $\lambda'$ can be prevented from passing through the gap between the via holes 56.

(4) In the second embodiment, the choke portion 50 is in an L shape, in a cross-sectional view of the substrate 2. Thus, when the substrate 2 has a small thickness, the depth of the choke portion 50 can be set to $\lambda'/4$.

Further, wiring of an electronic circuit can be formed in the substrate that is located in a lower layer relative to the ground wiring 57 and the via holes 56 forming the choke portion 50.

Third Embodiment

Figure 11:
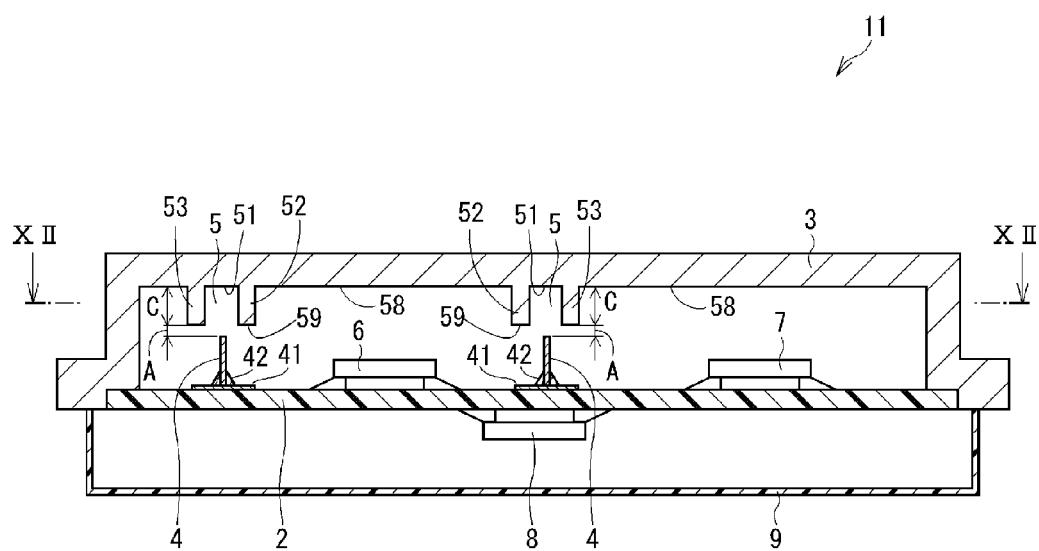
FIG. 11 is a cross-sectional view illustrating a high-frequency module according to a third embodiment.
Figure 12:
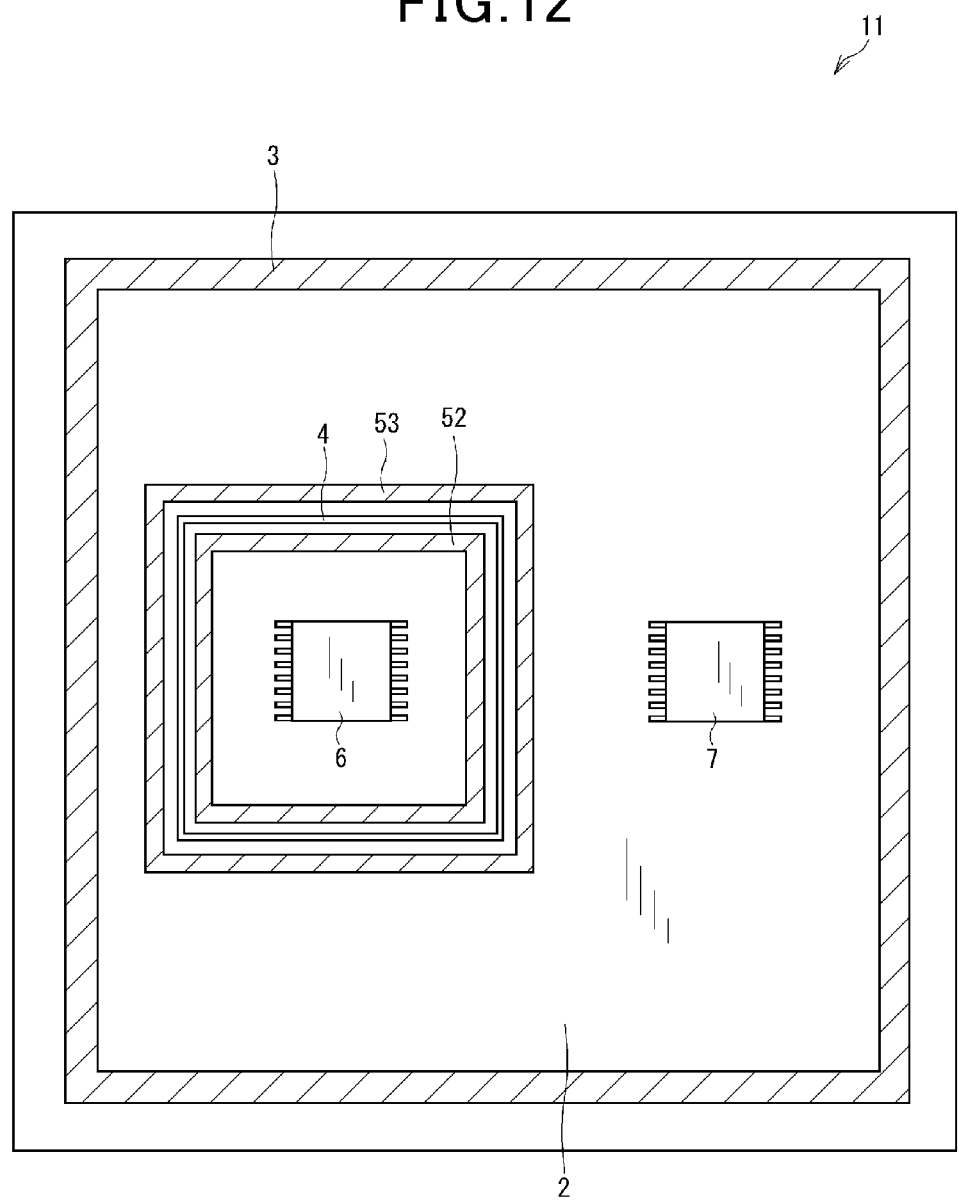
FIG. 12 is a cross-sectional view taken along a line XII-XII of FIG. 11.

Referring to FIGS. 11 and 12, a third embodiment of the present invention will be described.

In a high-frequency module 11 of the third embodiment, the groove 51 configuring the choke portion 5 is formed of a cylindrical inner frame 52 and a cylindrical outer frame 53 projecting parallel to each other from an inner wall 58 of the casing 3 toward the substrate. The groove 51 is provided between the inner frame 52 and the outer frame 53.

The casing 3, the inner frame 52 and the outer frame 53 may be integrally formed, or may be separately formed, followed by bonding by means of welding or the like.

It should be noted that, in the third embodiment, the inner frame 52 and the outer frame 53 each have an end face 59 on a substrate side, which corresponds to the "end face opposed to the shield of the casing".

In the third embodiment as well, the choke portion 5 has a depth C which is set to a length of $\lambda/4$.

Thus, the choke portion 5 is able to suppress the radio waves of the wavelength $\lambda$ from leaking out of the shield 4.

In the third embodiment, the thickness of the casing 3 can be reduced, regardless of the frequency $\lambda$ in use. Accordingly, the weight and the manufacturing cost of the high-frequency module 11 can be reduced.

Other Embodiments

In the foregoing embodiments, a high-frequency module used for a radar has been described. In another embodiment, a high-frequency module can be applied to various apparatuses, such as mobile phones, which oscillate high frequency waves.

In the foregoing embodiments, the shield and the choke portion are provided around the transmitting circuit. In another embodiment, the shield and the choke portion may be provided around the receiving circuit 7 or another signal processing circuit 8.

In the foregoing embodiments, the shield and the choke portion each has a square shape in a plan view. In another embodiment, the shield and the choke portion may each has a circular or polygonal shape in a plan view.

In the foregoing embodiments, the high-frequency module including the cylindrical shield that encloses an integrated circuit mounted on a substrate is characterized in that the choke portion provided in an inner wall of the casing opposed to the shield or provided in the substrate creates an antiphase in the radio waves of a predetermined frequency emitted from the integrated circuit into the space above the substrate.

Thus, the radio waves permitted to have an antiphase by the choke portion and the radio waves emitted from the integrated circuit cancel out each other to suppress the radio waves from leaking out of the shield. Thus, the signals generated by the integrated circuit are prevented from passing through the space above the substrate to prevent unintentional transmission of the radio wave signals to the receiving circuit mounted outside of the shield. This achieves good isolation of the signals received by the receiving circuit, thereby enhancing reliability of the output signals of the high-frequency module.

The present invention should not be construed as being limited to the foregoing embodiments, but may be implemented by combining the plurality of foregoing embodiments and the comparative examples, or may be implemented, in addition, in various modes within a scope not departing from the spirit of the present invention.

REFERENCE SIGNS LIST 1, 10, 11 . . . High-frequency module
2 . . . Substrate
3 . . . Casing
4, 44 . . . Shield
5, 50 . . . Choke portion
6 . . . Transmitting circuit (Integrated circuit)
7 . . . Receiving circuit (Integrated circuit)
8 . . . Signal processing circuit (Integrated circuit)

What is claimed is:

1. A high-frequency module wherein the module comprises:
   a substrate;
   an integrated circuit mounted to the substrate;
   a cylindrical shield enclosing the integrated circuit to block radio waves;
   a casing provided on an opposite side of the substrate relative to the shield to block radio waves; and
   a choke portion provided in an inner wall of the casing that is opposed to the shield or provided in the substrate with a predetermined gap relative to the shield to create an antiphase in radio waves having a predetermined frequency, the radio waves being emitted from the integrated circuit into a space above the substrate, wherein
   the choke portion is a groove that is recessed from an end face of the casing in a direction opposite to the shield, the end face being opposed to the shield, and
   the groove configuring the choke portion is formed of a cylindrical inner frame and a cylindrical outer frame projecting from an inner wall of the casing toward the substrate.

2. The high-frequency module according to claim 1, wherein the choke portion allows the radio waves having an antiphase to suppress radio waves from leaking through the gap between the choke portion and the shield.

3. The high-frequency module according to claim 1, wherein the choke portion has a depth corresponding to ¼ of a wavelength of the radio waves having a predetermined frequency when passing through the choke portion, the radio waves being emitted from the integrated circuit into the space above the substrate.

4. The high-frequency module according to claim 1, wherein the shield has an end portion on an opposite side of the choke portion, the end portion being connected to a ground wiring of the substrate or connected to the casing.

5. The high-frequency module according to claim 1, wherein the groove configuring the choke portion is provided between the cylindrical inner frame and the cylindrical outer frame which project from the inner wall of the casing toward the substrate.

6. The high-frequency module according to claim 1, wherein the choke portion is configured by a dielectric body extending from an end face of the substrate, the end face being opposed to the shield, in a direction opposite to the shield, a plurality of via holes juxtaposed outside the dielectric body, and a ground wiring connecting between the plurality of via holes.

7. The high-frequency module according to claim 6, wherein the dielectric body forms the substrate.

8. The high-frequency module according to claim 6, wherein the plurality of via holes are provided with a gap formed therebetween, the gap being not more than ¼ of a wavelength of the radio waves having a predetermined frequency when passing through the dielectric body, the radio waves being emitted from the integrated circuit into the space above the substrate.

9. The high-frequency module according to claim 6, wherein the choke portion has an L shape in a cross-sectional view of the substrate.

10. The high-frequency module according to claim 6, wherein the shield is integrally formed with the casing.

* * * * *